(12) United States Patent
Kondou et al.

(10) Patent No.: US 9,237,653 B2
(45) Date of Patent: Jan. 12, 2016

(54) ELECTRONIC CIRCUIT APPARATUS

(71) Applicant: DAIKIN INDUSTRIES, LTD., Osaka-shi, Osaka (JP)

(72) Inventors: Rei Kondou, Shiga (JP); Mitsuhiro Tanaka, Shiga (JP); Yoshitsugu Koyama, Shiga (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 14/425,558

(22) PCT Filed: Aug. 30, 2013

(86) PCT No.: PCT/JP2013/005150
§ 371 (c)(1),
(2) Date: Mar. 3, 2015

(87) PCT Pub. No.: WO2014/041756
PCT Pub. Date: Mar. 20, 2014

(65) Prior Publication Data
US 2015/0245490 A1 Aug. 27, 2015

(30) Foreign Application Priority Data

Sep. 13, 2012 (JP) ................................. 2012-201138

(51) Int. Cl.
*H01C 7/00* (2006.01)
*H05K 1/18* (2006.01)
*G01R 1/20* (2006.01)
(Continued)

(52) U.S. Cl.
CPC ................ *H05K 1/181* (2013.01); *G01R 1/203* (2013.01); *H01C 13/00* (2013.01); *H02P 6/002* (2013.01); *H05K 1/0296* (2013.01); *H05K 1/11* (2013.01); *H01C 1/084* (2013.01); *H05K 2201/10022* (2013.01)

(58) Field of Classification Search
CPC ........ H01C 1/014; H01C 7/003; H01C 1/144; H05K 3/328; H05K 2201/0209
USPC ............................................ 338/49, 332, 329
See application file for complete search history.

(56) References Cited

U.S. PATENT DOCUMENTS 5,258,736 A * 11/1993 Kristen .................. H01C 7/008
219/448.17
7,190,252 B2 * 3/2007 Smith .................... H01C 1/084
338/22 R
(Continued)

FOREIGN PATENT DOCUMENTS

JP          8-83969 A       3/1996
JP      2005-164469 A       6/2005
(Continued)

*Primary Examiner* — Kyung Lee
(74) *Attorney, Agent, or Firm* — Birch, Stewart, Kolasch & Birch, LLP

(57) ABSTRACT

For an electronic circuit apparatus including a shunt resistor, provided is a measure for improving the heat dissipation performance of the shunt resistor. The shunt resistor includes electrodes at both ends. One of the two electrodes is connected to a surface-mounting pattern on which the shunt resistor is surface-mounted. A current-generating-side pattern and a current-receiving-side pattern are arranged separately from the surface-mounting pattern. The current-generating-side pattern and the surface-mounting pattern are connected together via a connection member which creates a space between itself and a substrate.

16 Claims, 14 Drawing Sheets

(51) Int. Cl.
*H01C 13/00* (2006.01)
*H02P 6/00* (2006.01)
*H05K 1/02* (2006.01)
*H05K 1/11* (2006.01)
*H01C 1/084* (2006.01)

(56) References Cited

U.S. PATENT DOCUMENTS

| | | | | |
|---|---|---|---|---|
| 7,202,759 B2 * | 4/2007 | Blacka | ............ | H01P 1/227 333/81 A |
| 7,911,319 B2 * | 3/2011 | Smith | ............ | H01C 1/148 29/610.1 |
| 8,031,043 B2 * | 10/2011 | Schultz | ............ | H01C 1/014 338/254 |
| 8,471,674 B2 * | 6/2013 | Yoshioka | ............ | G01R 1/203 29/610.1 |
| 2009/0174522 A1 * | 7/2009 | Schulz | ............ | H01C 1/014 338/49 |
| 2011/0285498 A1 * | 11/2011 | Yoneda | ............ | H01C 1/014 338/306 |

FOREIGN PATENT DOCUMENTS

| | | |
|---|---|---|
| JP | 2008-294021 A | 12/2008 |
| JP | 2009-10082 A | 1/2009 |
| JP | 2011-155134 A | 8/2011 |
| JP | 2012-119507 A | 6/2012 |

* cited by examiner

ELECTRONIC CIRCUIT APPARATUS

TECHNICAL FIELD

The present invention relates to an electronic circuit apparatus for detecting a current value using a shunt resistor which is surface-mounted to a substrate, and more particularly relates to a measure for improving the heat dissipation performance of the surface-mounted shunt resistor.

BACKGROUND ART

A conventional shunt resistor (12) for detecting a current value includes a resistance element and electrodes (12a) and (12b) at both ends of the resistance element, as illustrated in FIG. 11. When such a shunt resistor (12) is surface-mounted to a substrate to detect a current value, patterns, of which the width is adjusted to that of the electrodes at both ends of the shunt resistor, are recommended as patterns (50) and (51) on which the shunt resistor (12) is surface-mounted, as illustrated in FIG. 12. In such recommended patterns, the current generated at a current-generating point (50a) flows perpendicularly to the electrodes (12a) and (12b) of the shunt resistor (12), passes laterally through the shunt resistor (12), and then flows toward a current inflow point (51a). A current detection circuit (40) is connected to the shunt resistor (12) through detection patterns (12C) connected to both ends of the shunt resistor (12), and detects the value of the flowing current based on a voltage value across the shunt resistor (12) detected through the detection pattern (12C) and a resistance value of the resistance element.

However, when the value of current flowing from a motor to a capacitor is detected by the shunt resistor (12), for example, the recommended patterns as illustrated in FIG. 12 are not adopted in many cases due to some limitations on the layout of components such as a power module for driving a motor and a capacitor. In that case, those elements are not arranged along the line that runs straight through the shunt resistor (12). For instance, a current-generating point (52a) of a pattern (52) connected to a power module for driving a motor and a current inflow point (53a) of a pattern (53) connected to a capacitor may be arranged diagonally to each other with the shunt resistor (12) interposed therebetween as illustrated in FIG. 13. In such cases, as illustrated in FIGS. 13 and 14, the current generated will be distributed all over the patterns, and will pass through the shunt resistor (12) not only laterally through it but also vertically through it, obliquely across it, and in various other directions. As a result, a potential difference is created in the direction in which the electrodes (12a) and (12b) of the shunt resistor (12) extend (i.e., in the longitudinal direction), resulting in occurrence of an error of the current value detected by the shunt resistor (12). Moreover, as illustrated in FIG. 15, if the output terminals of a three-phase motor are independently provided for the three phases U, V, and W and if the respective phases have their own current-generating points (52u), (52v), and (52w), the paths of the current flowing into the shunt resistor (12) will be different from each other between the three phases, resulting in a variation in current detection value from one phase to another, which is a problem with the related art.

In order to overcome such a problem, according to a conventional technique, the pattern (52) including the current-generating points and the pattern (53) including the current inflow point may be each provided with slits (60) around both of the electrodes of the shunt resistor (12) as illustrated in FIG. 16 to prevent the current paths from spreading right around the shunt resistor (12). On the other hand, according to another conventional technique, the pattern (54) including the current-generating points and the pattern (55) including the current inflow point may have their width that are narrowed toward the shunt resistor (12) and have their width matched to that of the shunt resistor (12) right around the shunt resistor (12) as illustrated in FIG. 17 to prevent the current paths from spreading too much and regulate the current paths into a desired shape, thereby reducing a dispersion in current detection value.

However, according to both of these conventional countermeasures illustrated in FIGS. 16 and 17, the current path of the patterns is narrowed in the vicinity of the shunt resistor (12), and the heat generated by the shunt resistor (12) is not transferred easily to these patterns to result in poor heat dissipation performance and causing the problem of heat generation by the shunt resistor (12).

The heat generated by the shunt resistor may be reduced by improving the heat dissipation performance of the patterns with their thickness increased, for example. However, the larger the amount of the current flowing through the shunt resistor is, the larger the quantity of heat generated by the shunt resistor is. For that reason, there is a limit to such a measure of adjusting the thickness of the patterns.

As for a conventional technique for improving the heat dissipation performance of a shunt resistor, Patent Document 1 discloses a configuration in which a radiator having a U-shaped cross-section is stacked on a resistance element (shunt resistor), including an electrode on a substrate, with a resistive base member interposed between them and in which the resistive base member and the radiator are bonded to each other with an adhesive having thermal conductivity and the radiator is crewed onto the substrate in order to improve the heat dissipation performance of the shunt resistor by utilizing the heat dissipation ability of the radiator.

CITATION LIST

Patent Document

PATENT DOCUMENT 1: Japanese Unexamined Patent Publication No. 2009-10082

SUMMARY OF THE INVENTION

Technical Problem

However, the conventional technique described above has various problems. For example, according to such a technique, it takes some time to perform the step of applying the adhesive and wait until the applied adhesive gets cured. In addition, the electrode of the shunt resistor could peel off, and get disconnected from, the substrate due to the weight of the radiator. Furthermore, to screw the radiator onto the substrate, not only screws but also the screwing step are needed. Moreover, while those members are being screwed together, damage could be done to the shunt resistor.

In view of these problems, the present invention is intended to provide an electronic circuit apparatus capable of effectively reducing a rise in the temperature of a shunt resistor without using a radiator.

Solution to the Problem

A first aspect of the present invention is directed to an electronic circuit apparatus in which a shunt resistor (12), including a resistance element between electrodes (12a) and (12b), is surface-mounted to a substrate (14) and in which electric current flowing from a pattern (16) on a side where current is generated (hereinafter referred to as "current-generating-side pattern (16)") into a pattern (17) on a side where the current is received (hereinafter referred to as "current-receiving-side pattern (17)") is detected by the shunt resistor (12) that is arranged on a path of the electric current. The apparatus is characterized in that at least one of the electrodes (12a) or (12b) of the shunt resistor (12) is connected to a surface-mounting pattern (13L) or (13R) on which the shunt resistor (12) is surface-mounted, and that the surface-mounting pattern (13L) or (13R) is connected to the current-generating-side pattern (16) or the current-receiving-side pattern (17) via a connection member (20) or (21) which creates a space (23) between itself and the substrate (14).

According to the first aspect of the invention, the heat generated by the shunt resistor is transferred from the surface-mounting pattern to the connection member, and is also dissipated through the space between the connection member and the substrate. Therefore, this configuration improves the heat dissipation performance of the shunt resistor, compared to a conventional configuration where the shunt resistor is connected via only the pattern on the substrate.

Moreover, the first aspect of the invention has the configuration where the connection member is arranged between the surface-mounting pattern for the shunt resistor and the current-generating-side pattern or the current-receiving-side pattern to improve the heat dissipation performance. Therefore, compared to the conventional configuration where a radiator is bonded to the shunt resistor, according to the first aspect of the invention, it is no longer necessary to perform the step of applying the adhesive or to wait until the applied adhesive gets cured, the electrode of the shunt resistor and the substrate will not be disconnected from each other due to the weight of a radiator, no screws for screwing the radiator on the substrate or screwing steps are needed anymore, and no damage will be done to the shunt resistor during the screwing step.

In a second aspect of the invention, in the electronic circuit apparatus of the first aspect, the connection member (20) or (21) is a bus bar made of a conductor having high thermal conductivity.

According to the second aspect of the invention, the bus bar has a wide surface area, and is made of a conductor having high thermal conductivity, such as copper, aluminum. Therefore, it is possible to further improve the heat dissipation performance of the shunt resistor.

Moreover, in a third aspect of the invention, in the electronic circuit apparatus of the first or second aspect, at a point where the electrode (12a) or (12b) of the shunt resistor (12) is connected to the surface-mounting pattern (13L) or (13R), the surface-mounting pattern (13L) or (13R) has a width set to be equal to the length (1) of the electrode (12a) or (12b) of the shunt resistor (12).

According to the third aspect of the invention, at the point where the electrode of the shunt resistor is connected to the surface-mounting pattern, the width of the surface-mounting pattern is equal to the length of the electrode of the shunt resistor. Therefore, the flowing direction of the current flowing into the shunt resistor tends to be perpendicular to the length direction of the electrode of the shunt resistor. Therefore, regardless of the location or size of the current-generating or current-receiving-side pattern, a potential difference is hardly created in the length direction of the electrode of the shunt resistor, leading to improvement of the accuracy of a current value detected by the shunt resistor.

Besides, in a fourth aspect of the invention, in the electronic circuit apparatus of any one of the first to third aspects, the connection member (20) or (21) includes a leg (20a) or (21a) arranged on the upper surface of the surface-mounting pattern (13L) or (13R) and having a predetermined height (h), a leg (20b) or (21b) arranged on the upper surface of the current-generating-side pattern (16) or the current-receiving-side pattern (17) and having a predetermined height (h), and a connector (20c) or (21c) connecting the leg (20a) or (21a) and the leg (20b) or (21b) together.

According to the fourth aspect of the invention, the connection member has the legs to create a wide space which is as high as the legs under the connector. Therefore, the heat generated by the shunt resistor is dissipated through the wide space to further improve the heat dissipation performance of the shunt resistor.

In a fifth aspect of the invention, in the electronic circuit apparatus of any one of the first to fourth aspects, the current-generating-side pattern (16) is divided into a plurality of sub-patterns (16U), (16V), and (16W) each including one current-generating point, and the sub patterns (16U), (16V), and (16W) are connected to the surface-mounting pattern (13R) for the shunt resistor (12) via connection members (20a), (20b), and (20c), respectively.

According to the fifth aspect of the invention, the sub-patterns of the current-receiving-side pattern are connected to the surface-mounting pattern for the shunt resistor via the respective connection members. Therefore, the number of the connection members increases to expand the area of the surface that dissipates the heat generated by the shunt resistor, thereby improving the heat dissipation performance of the shunt resistor significantly.

Advantages of the Invention

As described above, the first aspect of the invention has the configuration where the surface-mounting pattern for the shunt resistor is separated from the current-generating or current-receiving-side pattern, and they are connected via the connection member that creates a space between itself and the substrate. Therefore, the heat dissipation performance of the shunt resistor can be improved without using a conventional configuration in which a radiator is bonded to the shunt resistor.

According to the second aspect of the invention, the connection member is implemented as a bus bar made of a conductor having high thermal conductivity, such as copper or aluminum. Therefore, it is possible to increase the thermal conductivity of the connection member, secure a wide heat-dissipating surface area, and further improve the heat dissipation performance of the shunt resistor.

According to the third aspect of the invention, the surface-mounting pattern for the shunt resistor, separated from the current-generating or current-receiving-side pattern, has its width set to be equal to the length of the electrode of the shunt resistor to allow the current to flow laterally through the shunt resistor. Therefore, regardless of the location or the size of the current-generating or current-receiving-side pattern, the shunt resistor can detect the current more accurately.

Besides, according to the fourth aspect of the invention, creation of a wide space under the connection member, and dissipation of the heat generated by the shunt resistor using that space further improve the heat dissipation performance of the shunt resistor.

According to the fifth aspect of the invention, an increase in the number of the connection members provided, and expansion of the area of the surface that dissipates the heat generated by the shunt resistor further improve the heat dissipation performance of the shunt resistor.

DESCRIPTION OF EMBODIMENTS

Embodiments of the present invention will be described in detail based on the drawings. The following embodiments are merely a preferred example in nature, and are not intended to limit the scope, applications, and use of the invention.

(First Embodiment)

Figure 1:
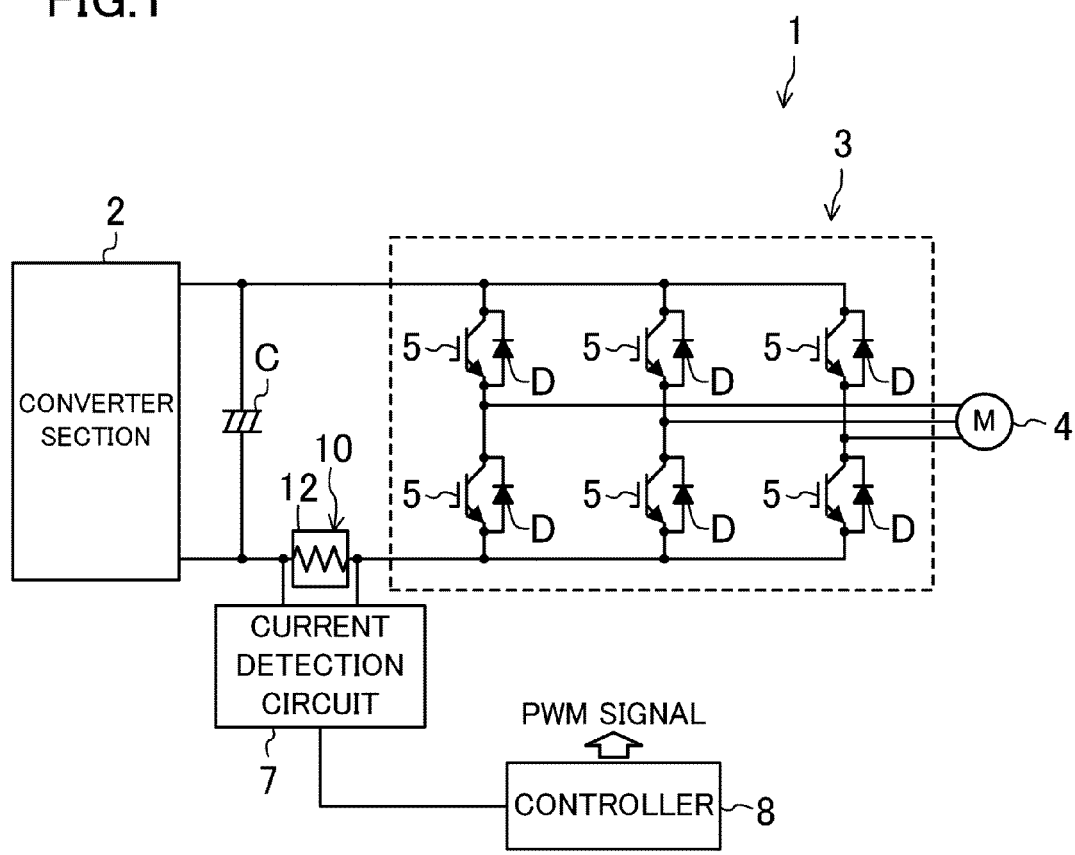
FIG. 1 is a circuit diagram of a power conversion circuit including an electronic circuit apparatus as a first embodiment of the present invention.

FIG. 1 illustrates an exemplary circuit configuration for a power converter (1) including an electronic circuit apparatus according to a first embodiment of the present invention.

This power converter (1) includes a converter section (2) converting an alternating current voltage from an alternating current power source, which is not shown, to a direct current voltage, an inverter section (3) converting the direct current voltage converted by the converter section (2) to a three-phase alternating current voltage, and an electrolytic capacitor (C) arranged between the inverter section (3) and the converter section (2). The inverter section (3) includes six switching elements (5), such as insulated gate bipolar transistors (IGBTs) or metal-oxide-semiconductor field-effect transistors (MOSFETs), in which diodes (D) are connected in antiparallel to one another, and is three-phase bridge connected. The inverter section (3) is connected to a three-phase motor (4) driving the compressor of an air conditioner, for example, and supplies power from the power converter (1) to the air conditioner. The three-phase motor (4) may be an interior permanent magnet synchronous motor (IPM), for example.

In order to detect the current of the three-phase motor (4), an electronic circuit apparatus (10) including a shunt resistor (12) is arranged at a node where the power converter (1) is connected to the electrolytic capacitor (C), and when the electric current flows from the three-phase motor (4) into the electrolytic capacitor (C) through the shunt resistor (12), a current detection circuit (7) detects the current flowing through the shunt resistor (12). The current detected by the current detection circuit (7) is fed to a controller (8), which adjusts, based on the motor current detected by the current detection circuit (7), a pulse width modulation (PWM) control signal that will be output to each of the six switching elements (5) of the inverter section (3) to turn the voltage to be supplied to the three-phase motor (4) into a three-phase alternating current voltage.

Figure 2:
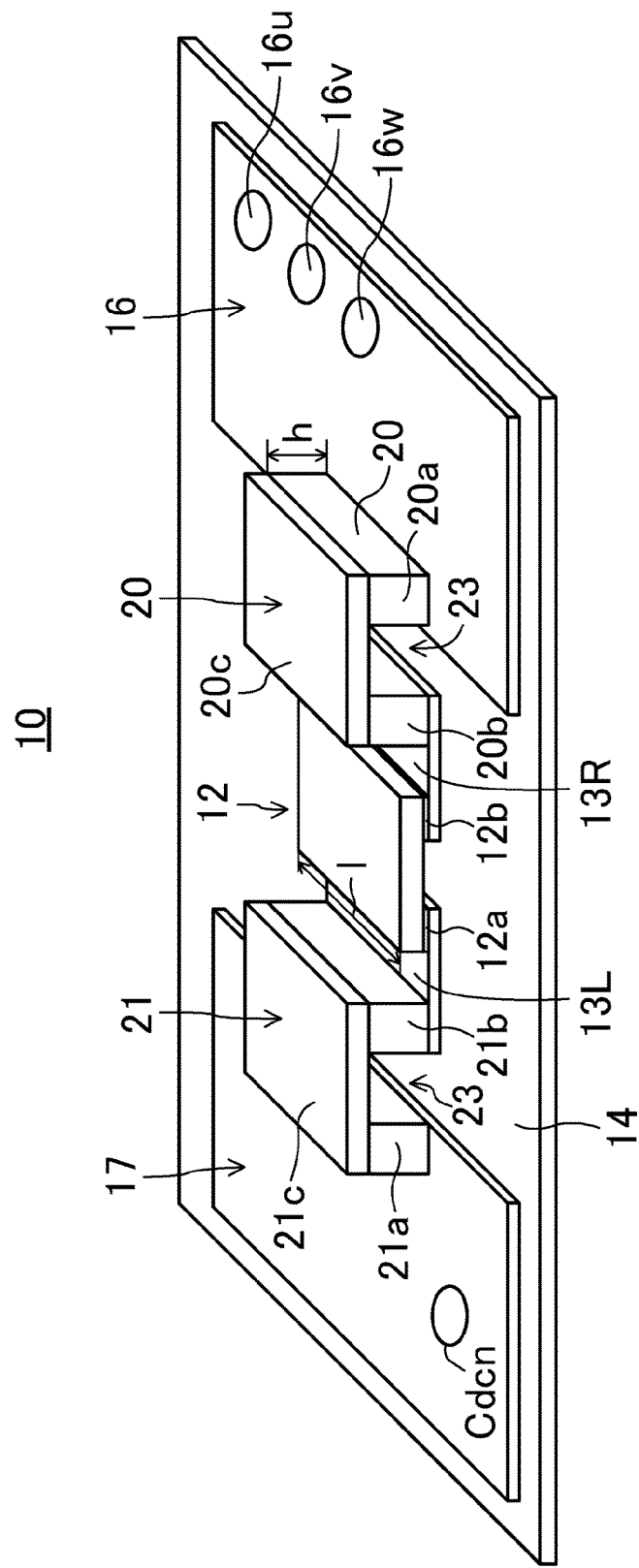
FIG. 2 is a perspective view illustrating a portion of the electronic circuit apparatus between a grounded side of a power module and an electrolytic capacitor.
Figure 3:
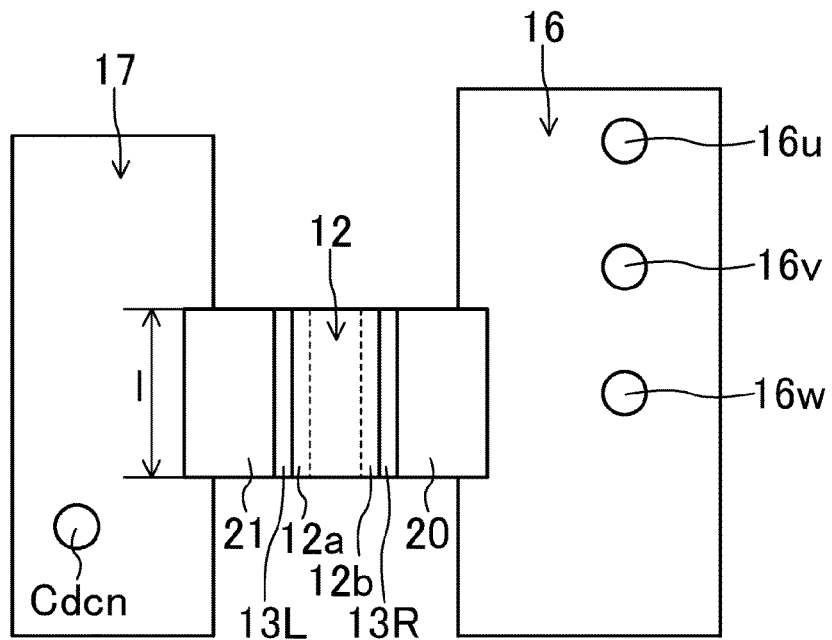
FIG. 3 is a top view of the electronic circuit apparatus.

Next, the electronic circuit apparatus (10) including the shunt resistor (12) will be described with reference to FIGS. 2 and 3. FIG. 2 is a perspective view of the overall apparatus, and FIG. 3 is a top view. In the electronic circuit apparatus (10) illustrated in these drawings, the shunt resistor (12) is surface-mounted to a substrate (14) with two surface-mounting patterns (13L) and (13R). The electrode (12a) arranged on the lower surface of a left end portion of the shunt resistor (12) on the paper is connected to the upper surface of a right end portion of the surface-mounting pattern (13L) arranged on the left side of the paper. On the other hand, the electrode (12b) arranged on the lower surface of a right end portion of the shunt resistor (12) on the paper is connected to the upper surface of a left end portion of the surface-mounting pattern (13R) arranged on the right side of the paper.

In this electronic circuit apparatus (10), a main circuit pattern (16) connected to the three-phase motor (4) and a main circuit pattern (17) connected to the electrolytic capacitor (C) are respectively arranged at the right and left ends of the substrate (14) on the paper. The main circuit pattern (16) at the right end of the substrate (14) is formed to have a larger area than the shunt resistor (12), and has portions which are connected to a U-phase, a V-phase, and a W-phase of the three-phase motor (4) and into which a U-phase current (iu), a V-phase current (iv), and a W-phase current (iw) flow from the three-phase motor (4). In other words, the main circuit pattern (16) has a U-phase current-generating point (16u), a V-phase current-generating point (16v), and a W-phase current-generating point (16w). These current-generating points are densely arranged on a portion of the main circuit pattern (16) at the upper right end on the paper. On the other hand, the main circuit pattern (17) at the left end of the substrate (14) is also formed to have a larger area than the shunt resistor (12), and has a current inflow point (Cdcn) from which current flows into the electrolytic capacitor (C). The current inflow point (Cdcn) is arranged locally on a portion of the main circuit pattern (17) at the lower left end on the paper. In the main circuit pattern (16) on the current-generating side and in the main circuit pattern (17) on the current-receiving side, their relative positions with the shunt resistor (12), the relative positions among the current-generating points (16u)-(16w), and the relative position of the current inflow point (Cdcn) are constrained by the layout of the power module for driving the three-phase motor (4) and the electrolytic capacitor (C) and other factors.

As described above, in the configuration in which the surface-mounting patterns (13L) and (13R) for the shunt resistor (12) and the main circuit patterns (16) and (17) are separated from one another and independently arranged, the surface-mounting pattern (13R) on the right side of the shunt resistor (12) on the paper and the main circuit pattern (16) on the current-generating side are connected together via a bus bar (20), and the surface-mounting pattern (13L) on the left side of the shunt resistor (12) on the paper and the main circuit pattern (17) on the current-receiving side are connected together via a bus bar (21).

As can be seen from the perspective view of FIG. 1, the bus bar (20) on the right side of the paper includes a leg (20a) which has a predetermined height (h) and which is arranged on the left end portion of the main circuit pattern (16) on the current-generating side and, a leg (20b) which has the predetermined height (h) and which is arranged on the right end portion of the surface-mounting pattern (13R) for the shunt resistor (12), and a connector (20c) connecting these two legs (20a) and (20b) together. Likewise, the bus bar (21) on the left side of the paper also includes a leg (21a) which has a predetermined height (h) and which is arranged on the right end portion of the main circuit pattern (17) on the current-receiving side and, a leg (21b) which has the predetermined height (h) and which is arranged on the left end portion of the surface-mounting pattern (13R) for the shunt resistor (12), and a connector (21c) connecting these two legs (20a) and (20b) together. Both of these two bus bars (20) and (21) are made of a conductor having high thermal conductivity, such as copper or aluminum, for example. By adopting the bus bars (20) and (21) with such a configuration, heat-dissipating spaces (23) are created between a pair of legs (20a) and (20b) and between another pair of leas (21a) and (21b) so as to have a height that is equal to the sum of the thickness of the main circuit pattern (16) or (17) and the height (h) of the legs. Each of the two bus bars (20) and (21) is supposed to have such a configuration in which two legs are connected together via one connector. However, each of the bus bars (20) and (21) may naturally be a single plate that has been bent into a similar shape.

Moreover, the length of the electrodes (12a) and (12b) at both ends of the shunt resistor (12) is set to be equal to a predetermined length (1). Likewise, the length of the two surface-mounting patterns (13L) and (13R) as measured in the direction in which the two electrodes extend, and the length of the legs (20a), (20b), (21a), and (21b) and connectors (21c) and (21c) of the two bus bars (20) and (21) as measured in the direction in which the two electrodes extend are also set to be equal to the length (the predetermined length (1)) of the electrodes (12a) and (12b) of the shunt resistor (12). On the other hand, the length of the two main circuit patterns (16) and (17) as measured in the direction in which the two electrodes of the shunt resistor (12) extend is set to be longer than the predetermined length (1).

Figure 4:
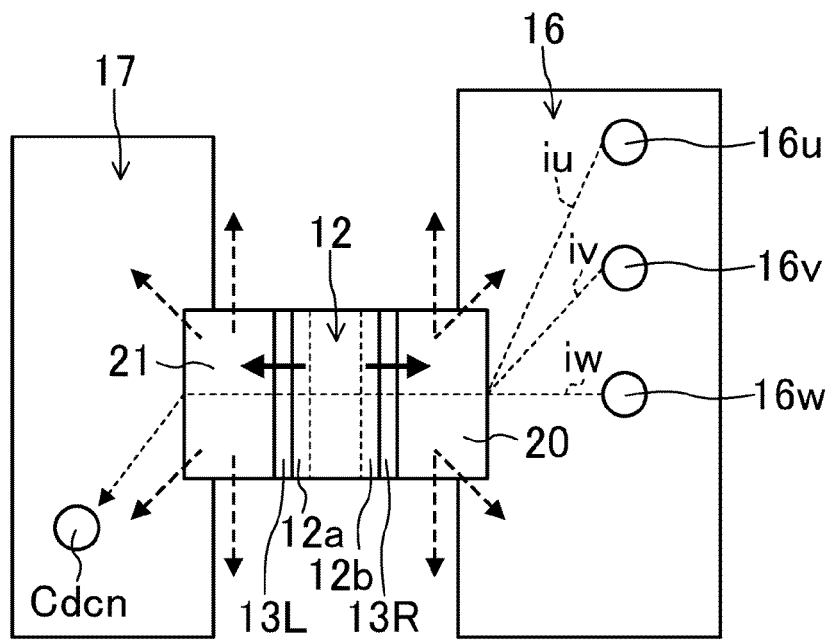
FIG. 4 illustrates a path of electric current flowing through the electronic circuit apparatus, and a dissipation path of heat generated by the shunt resistor.

Therefore, according to this embodiment, when currents (iu)-(iw) in respective phases which have been generated from the respective current-generating points (16u)-(16w) of the main circuit pattern (16) on the current-generating side are flowing into the current inflow point (Cdcn) of the main circuit pattern (17) on the current-receiving side through the shunt resistor (12), their current paths are blocked by the bus bars (20) and (21) which are made of a conductor and which are respectively located on the right and left sides of the shunt resistor (12). That is why the heat generated by the shunt resistor (12) is transferred to the two bus bars (20) and (21) as indicated by the bold solid arrows in FIG. 4, thus facilitating the heat transfer. In addition, the heat is also dissipated from the bus bars (20) and (21) to all directions as indicated by the bold dotted arrows on the same figure. Moreover, the heat is further dissipated downward through the heat-dissipating space (23) between the lower surface of each of the bus bars (20) and (21) and the substrate (14), thereby effectively reducing a rise in the temperature of the shunt resistor (12).

In particular, according to the embodiment, the surface-mounting patterns (13L) and (13R) for the shunt resistor (12) and the main circuit patterns (16) and (17) are separated from one another, and the surface-mounting patterns (13L) and (13R) and the main circuit patterns (16) and (17) are connected together via the bus bars (20) and (21). That is why the heat dissipation portions (the bus bars (20) and (21)) can have a wider surface area and the heat dissipation performance of the shunt resistor (12) can be improved, compared to a conventional configuration in which a surface-mounting pattern and a main circuit pattern are integrated together.

Since the members that dissipate the heat generated by the shunt resistor (12) are the bus bars (20) and (21) made of a conductor having high thermal conductivity, such as copper or aluminum, the heat can be transferred even more satisfactorily, and the heat dissipation performance of the shunt resistor (12) can be further improved.

Furthermore, since the bus bars (20) and (21) have the leas (20a), (20b), (21a), and (21b), and a wide heat-dissipating space (23) which is as high (h) as the legs has been created under the connectors (21c) and (21c), the heat generated by the shunt resistor (12) can be also dissipated through even such a wide heat-dissipating space (23). As a result, the heat dissipation performance of the shunt resistor (12) can be further improved.

Besides, according to this embodiment, the shunt resistor (12), the two surface-mounting patterns (13L) and (13R) thereof, and the two bus bars (20) and (21) all have the same length (1) as that (1) of the electrode of the shunt resistor (12). Therefore, the currents (iu)-(iw) in respective phases generated from the current-generating points (16u)-(16w) of the main circuit pattern (16) on the current-generating side flow obliquely toward the bus bar (21) on the right side of the shunt resistor (12) as indicated by the thin dotted arrows in FIG. 4. However, these currents have their flow rectified after passing through the bus bar (21), and all flow across the shunt resistor (12) perpendicularly to the electrodes (12a) and (12b). Therefore, no matter where the main circuit patterns (16) and (17), the current-generating points (16u)-(16w) inside them, and the current inflow point (Cdcn) inside them should be arranged due to the constrains on the layout of the power module for driving the three-phase motor (4) and the electrolytic capacitor (C), a potential difference is hardly created in the shunt resistor (12) in the length direction of its electrodes (12a) and (12b), and the accuracy of a current value detected by the shunt resistor (12) can be kept high.

In addition, according to this configuration, the bus bar (20) and (21) are arranged between the surface-mounting patterns (13R) and (13L) for the shunt resistor (12) and the main circuit patterns (16) and (17) on the current-generating side and on the current-receiving side. That is why compared to a conventional configuration where a radiator is bonded to a resistance element of the shunt resistor (12), the electronic circuit apparatus (10) of this embodiment does not have to do the step of applying an adhesive or wait until the adhesive gets cured, will not cause the electrode of the shunt resistor to be disconnected from the substrate due to the weight of the radiator, does not need a screw member for screwing the radiator onto the substrate or the screwing step, and will cause no damage to the shunt resistor during the screwing step.

Modified Example

Figure 5:
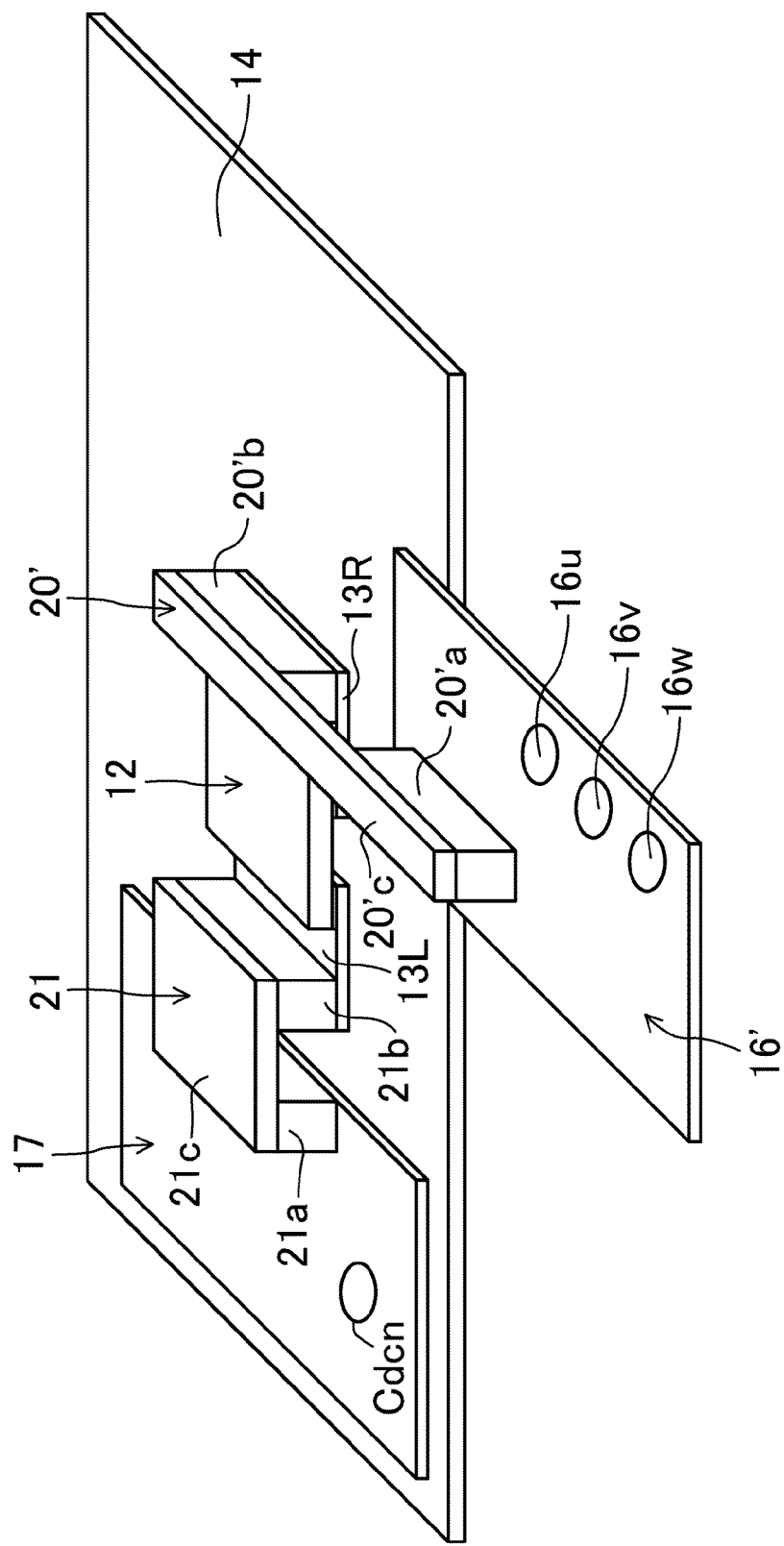
FIG. 5 is a perspective view illustrating a portion of an electronic circuit apparatus of a modified example of the embodiment between a grounded side of a power module and an electrolytic capacitor.
Figure 6:
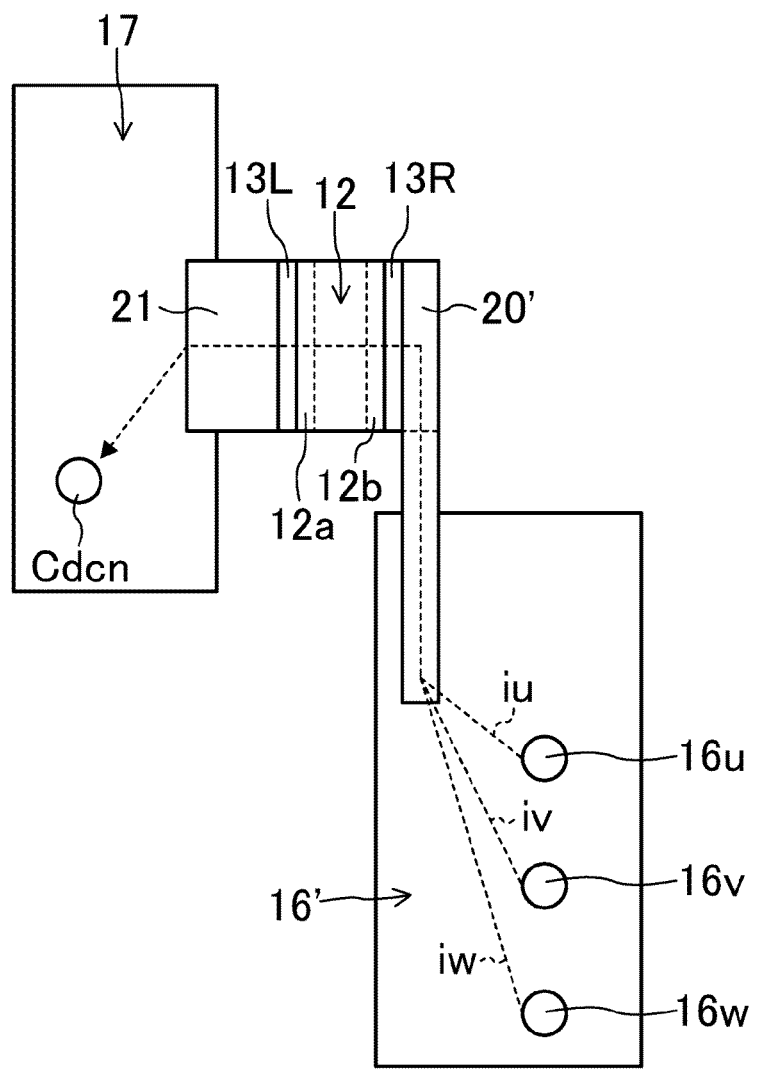
FIG. 6 is a top view of the electronic circuit apparatus.

FIGS. 5 and 6 illustrate a modified example of the first embodiment.

In this modified example, FIG. 5 is a perspective view of the overall apparatus and FIG. 6 is a top view thereof. In this modified example, a main circuit pattern (16') on the current-generating side is arranged at a different location so that the main circuit pattern (16') is arranged below the substrate (14) on the paper due to a layout constraint on the power module for driving the three-phase motor (4), and only an upper end portion thereof is arranged on the substrate (14) on the paper and the rest of the pattern protrudes downward from the substrate (14).

In the main circuit pattern (16') on the current-generating side according to the modified example, the U-phase, V-phase, and W-phase current-generating points (16$u$), (16$v$), and (16$w$) are densely arranged at a lower end portion thereof.

According to such a configuration, a bus bar (20') on the right side of the paper is formed so that a connector (20'$c$) is elongated from the surface-mounting pattern (13R) toward the main circuit pattern (16') on the current-generating side, an upper end portion of the connector (20'$c$) having such a shape is connected to a leg (20'$b$) arranged on the surface-mounting pattern (13R) and having a predetermined length (l), and a lower end portion of the connector (20'$c$) is connected to a leg (20'$a$) arranged on an upper end portion of the main circuit pattern (16') on the current-generating side and having a predetermined length (I). Since the other members are the same as their counterparts of the first embodiment, those members are identified by the same reference numerals as their counterparts' and description thereof will be omitted herein.

Therefore, according to this modified example, the surface-mounting pattern (13R) and the main circuit pattern (16') on the current-generating side are also separated from each other, and are connected via the bus bar (20') made of a conductor having high thermal conductivity. Therefore, as in the first embodiment, the heat generated by the shunt resistor (12) is also dissipated through the bus bar (20') having a wide surface area and the heat dissipation performance of the shunt resistor (12) can also be improved.

In addition, according to this modified example, the U-phase current (iu), the V-phase current (iv), and the W-phase current (iw) respectively generated from the current-generating points (16$u$), (16$v$), and (16$w$) of the main circuit pattern (16') on the current-generating side flow obliquely upper-leftward on the main circuit pattern (16') as indicated by the thin dotted arrows in FIG. 6. Then, those currents flow straight through the connector (20'$c$) of the bus bar (20') from the leg (20'$a$), changes the flowing directions at the leg (20'$b$), and then flow perpendicularly to the length direction of the electrodes (12$a$) and (12$b$) of the shunt resistor (12) toward the surface-mounting pattern (13R), the shunt resistor (12), and the surface-mounting pattern (13L) arranged on the left side of the shunt resistor (12), all of which have the same predetermined length (1). Therefore, even if the main circuit pattern (16') on the current-generating side and the respective current-generating points (16$u$), (16$v$), and (16$w$) thereof are not arranged laterally to the shunt resistor (12), the accuracy of a current value detected by the shunt resistor (12) can also be increased.

In this modified example, the main circuit pattern (16') on the current-generating side is not supposed to be arranged laterally to the shunt resistor (12). However, this is only an example. Naturally, however, the same kind of modification is applicable to the other members as well. For example, the main circuit pattern (17) on the current-receiving side may not be arranged laterally to the shunt resistor (12), or both of the main circuit pattern (16) on the current-generating side and the main circuit pattern (17) on the current-receiving side may not be arranged laterally to the shunt resistor (12).

(Second Embodiment)

Next, a second embodiment of the present invention will be described.

Figure 7:
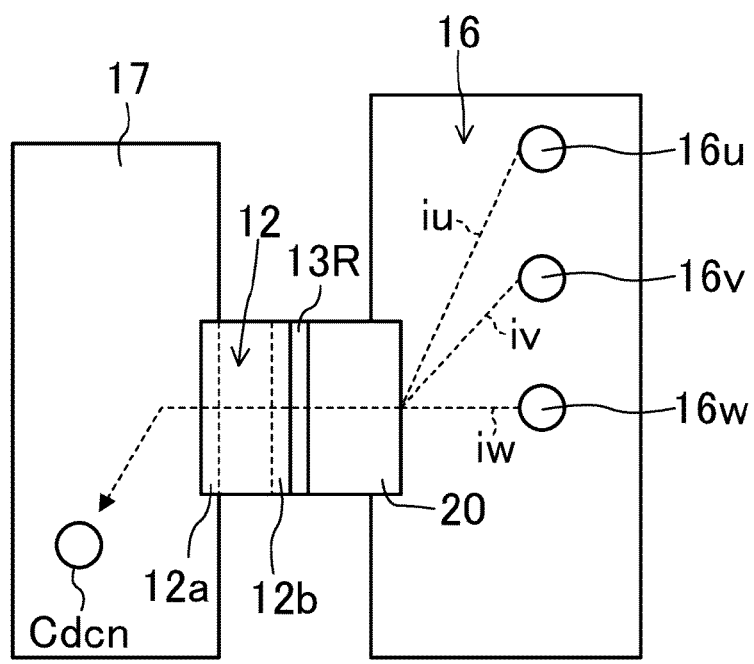
FIG. 7 is a top view of an electronic circuit apparatus as a second embodiment of the present invention.

FIG. 7 illustrates a top view of an electronic circuit apparatus according to the second embodiment of the present invention. In this embodiment, no surface-mounting patterns and no bus bars are arranged on the left side of the shunt resistor (12) on the paper.

Specifically, the surface-mounting pattern (13R) arranged on the right side of the shunt resistor (12) on the paper and the main circuit pattern (16) on the current-generating side are connected together via a bus bar (20) having a leg and made of a conductor having high thermal conductivity just like the bus bar (20) illustrated in FIG. 2, and the electrode (12$a$) arranged on the left side of the shunt resistor (12) on the paper is arranged on the main circuit pattern (17) on the current-receiving side.

In this embodiment, the bus bar (20) is arranged only on the right side of the shunt resistor (12) on the paper, but the heat dissipation performance of the shunt resistor (12) is still improved by the bus bar (20), compared to a conventional configuration in which the shunt resistor is connected with only patterns on both of the right and left sides.

In the embodiment described above, the bus bar (20) is supposed to be provided only for the main circuit pattern (16) on the current-generating side. However, this is only an example. Naturally, the bus bar may also be provided only for the main circuit pattern (17) on the current-receiving side.

(Third Embodiment)

Next, a third embodiment of the present invention will be described.

Figure 8:
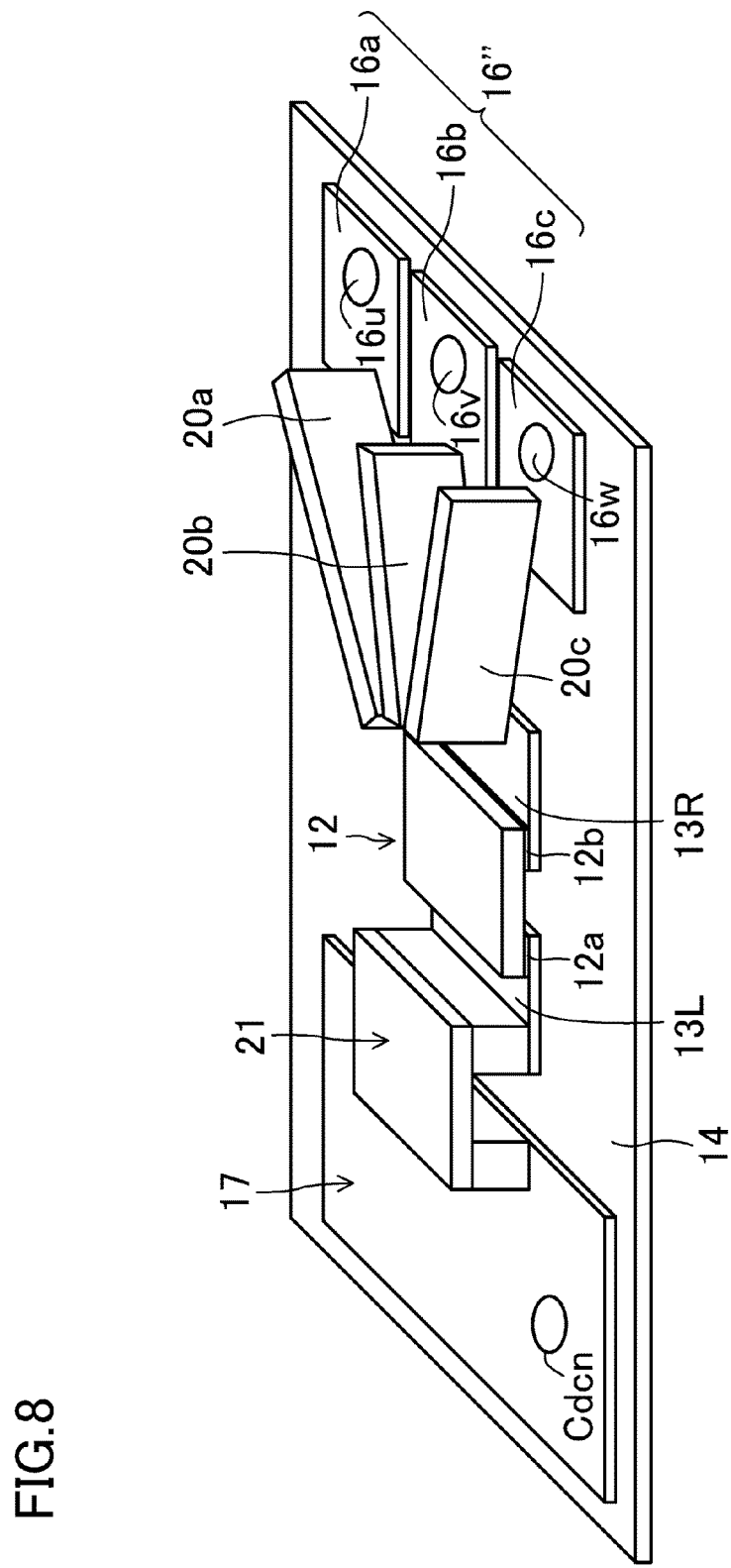
FIG. 8 is a perspective view of an electronic circuit apparatus as a third embodiment of the present invention.
Figure 9:
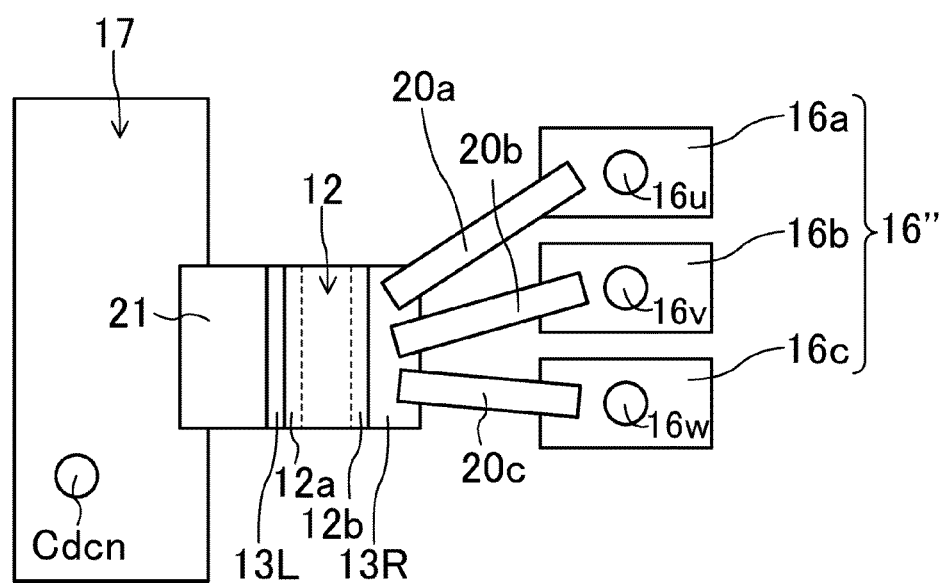
FIG. 9 is a top view of the electronic circuit apparatus.

FIGS. 8 and 9 illustrate an example of an electronic circuit apparatus according to this embodiment. FIG. 8 is a perspective view of the overall apparatus and FIG. 9 is a top view thereof. In this embodiment, a main circuit pattern (16") on the current-generating side is divided into three parts, namely, a sub-pattern (16$a$) having the U-phase current-generating point (16$u$), a sub-pattern (16$b$) having the V-phase current-generating point (16$v$), and a sub-pattern (16$c$) having the W-phase current-generating point (16$w$).

According to this configuration, the three sub-patterns (16$a$)-(16$c$) on the current-generating side are connected to the surface-mounting pattern (13R) on the right side of the shunt resistor (12) via rectangular-parallelepiped bus bars (20$a$), (20$b$), and (20$c$), each made of a conductor having high thermal conductivity.

Therefore, according to this embodiment, the three rectangular parallelepiped bus bars (20$a$)-(20$c$) are connected to the surface-mounting pattern (13R) on the right side of the shunt resistor (12), and therefore, the area of the surface that dissipates the heat generated by the shunt resistor (12) can be further increased, thereby improving the heat dissipation performance of the shunt resistor (12) significantly.

(Fourth Embodiment)

Subsequently, a fourth embodiment of the present invention will be described.

Figure 10:
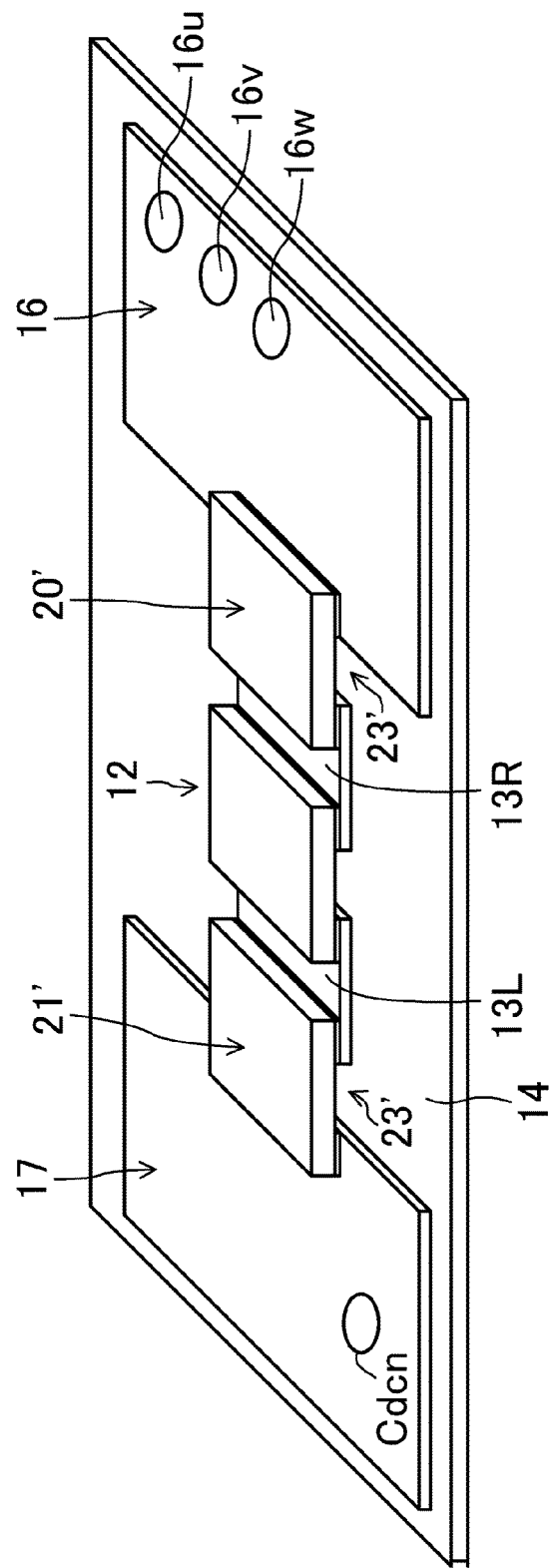
FIG. 10 is a perspective view of an electronic circuit apparatus as a fourth embodiment of the present invention.
Figure 11:
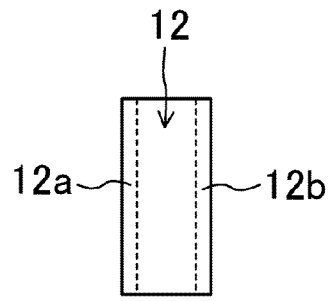
FIG. 11 is a top view illustrating a configuration for a general shunt resistor.
Figure 12:
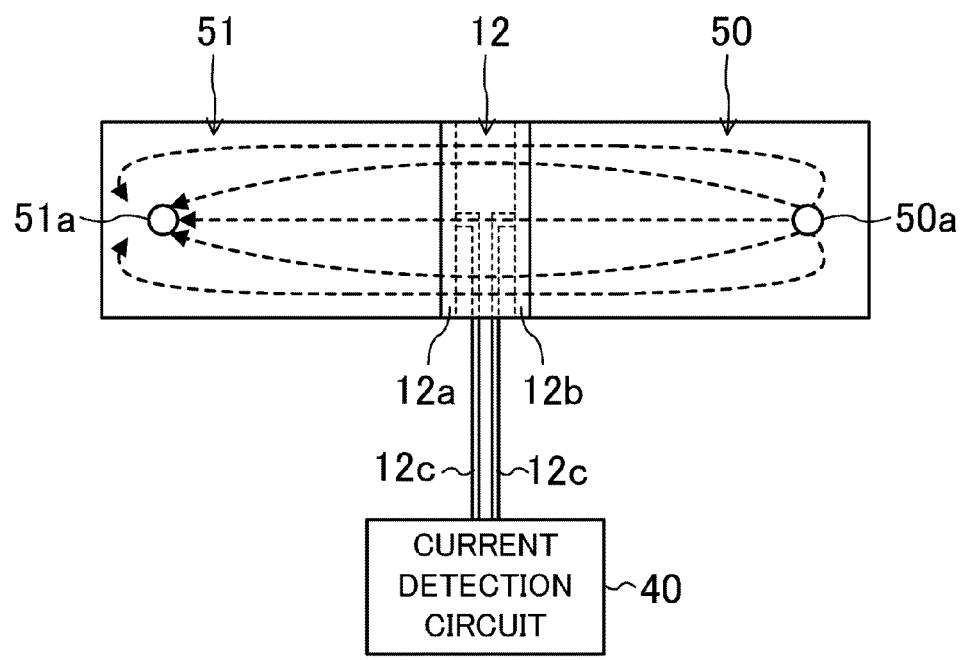
FIG. 12 is a view illustrating a conventional configuration having recommended patterns for detecting a current value using a shunt resistor.
Figure 13:
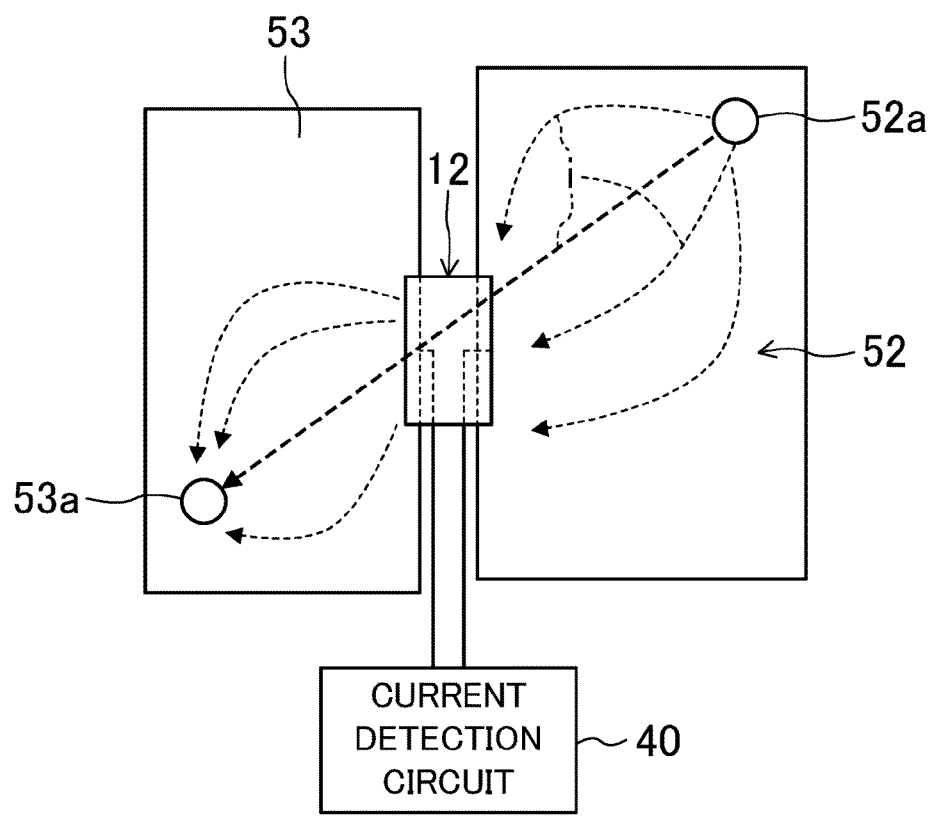
FIG. 13 is a view illustrating exemplary paths of electric current flowing when a current-generating point and a current inflow point are arranged diagonally with the shunt resistor interposed therebeween.
Figure 14:
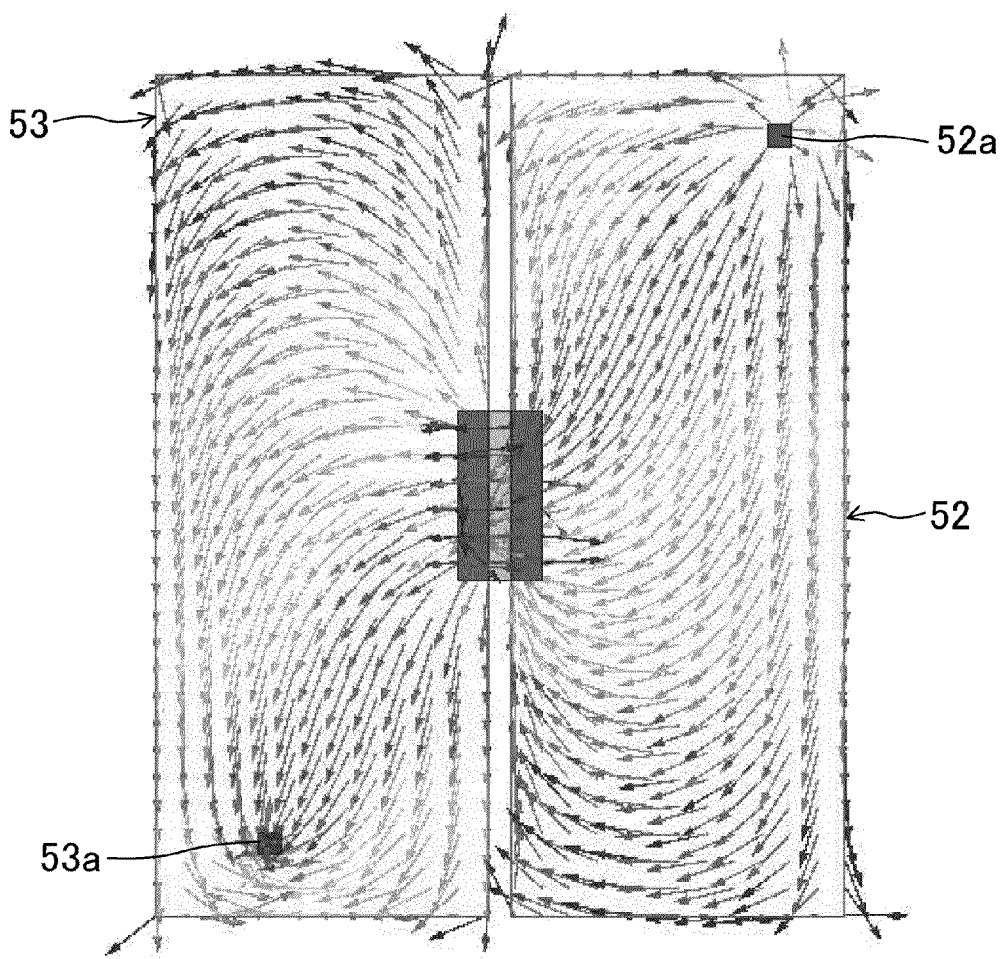
FIG. 14 is a view that simulates the paths of such electric current.
Figure 15:
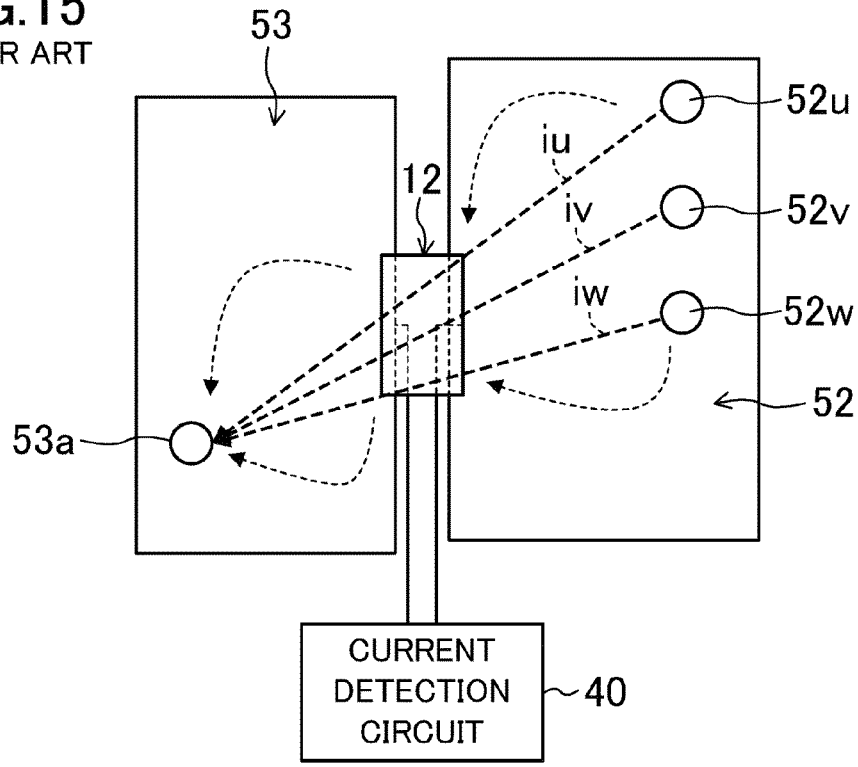
FIG. 15 is a view illustrating current paths in a situation where the current-generating-side pattern has three current-generating points.
Figure 16:
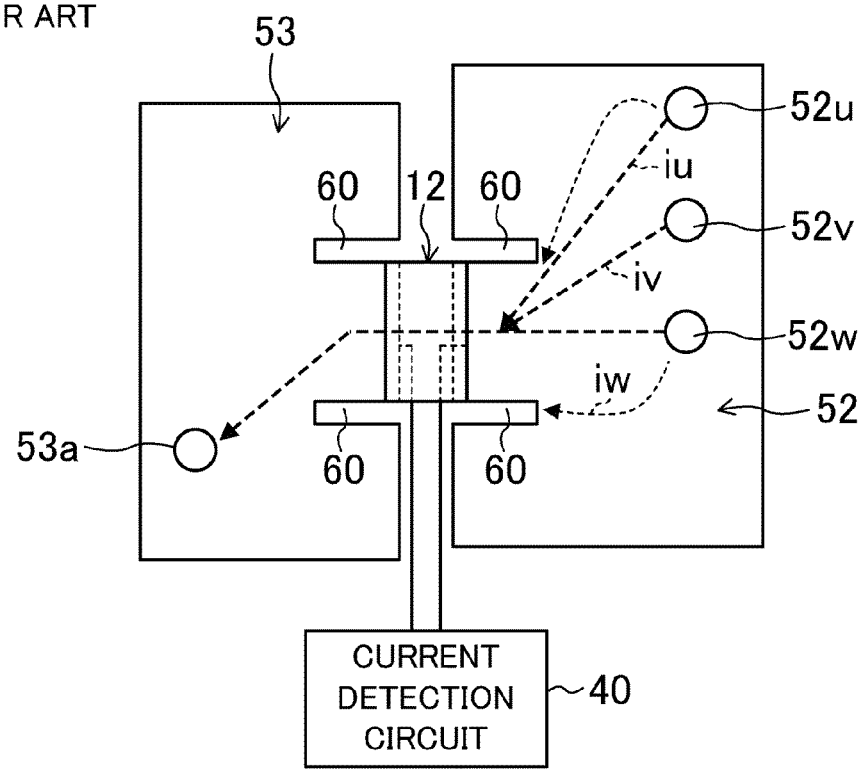
FIG. 16 is a view illustrating a conventional configuration in which slits are cut through both of a current-generating-side pattern and a current-receiving-side pattern.
Figure 17:
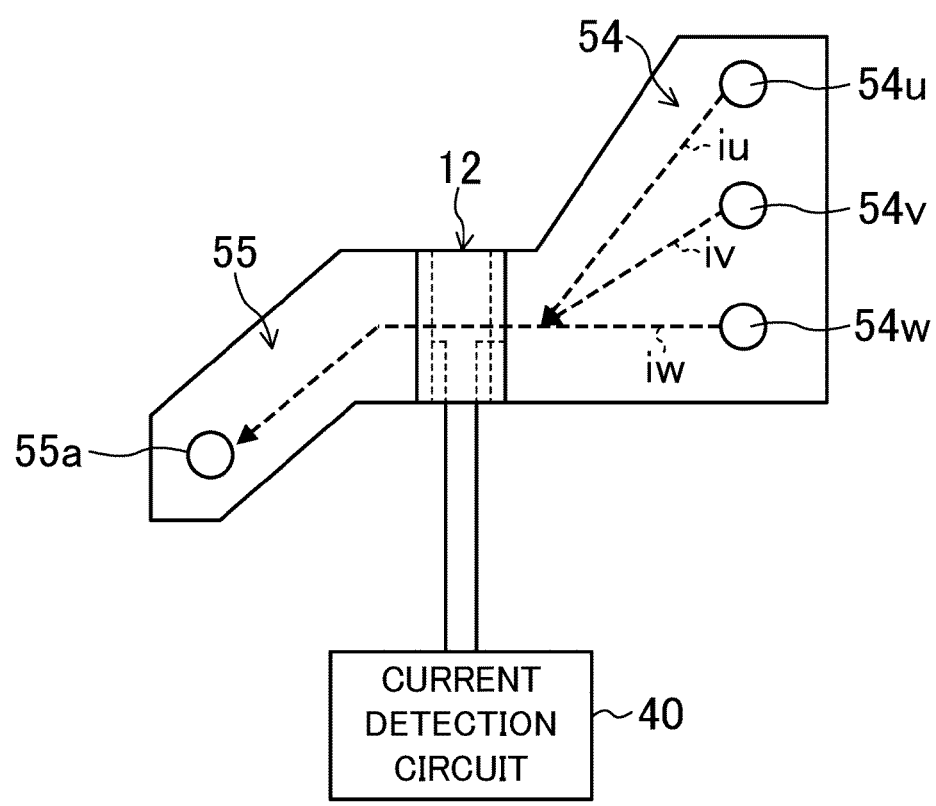
FIG. 17 is a view illustrating a conventional configuration in which both of the current-generating-side pattern and the current-flowing pattern have their width matched to that of the shunt resistor around the shunt resistor.

FIG. 10 is a perspective view illustrating an example of an electronic circuit apparatus according to this embodiment. In this embodiment, the shapes of the bus bars are changed such that a bus bar (20') connecting the upper surface of the surface-mounting pattern (13R) on the right side of the shunt resistor (12) and the upper surface of the main circuit pattern (16) on the current-generating side together, and a bus bar (21') connecting the upper surface of the surface-mounting pattern (13L) on the left side of the shunt resistor (12) and the upper surface of the main circuit pattern (17) on the current-receiving side together have a quadrangle plate shape, of which the length (1) is defined in the length direction of the electrode of the shunt resistor (12). And unlike the bus bars (20) and (21) of the first to third embodiments, no legs (20a), (20b), (21a), and (21b) having a predetermined height (h) are provided for these bus bars (20', 21').

According to the configuration of these bus bars (20') and (21'), no legs (20a), (20b), (21a), and (21b) having a predetermined height (h) are provided unlike the first to third embodiments, and therefore, the heat-dissipating space (23') created becomes narrower. However, since the height of this heat-dissipating space (23') is equal to the thickness of the main circuit pattern (16), the heat generated by the shunt resistor (12) can also be dissipated effectively through the heat-dissipating space (23') under the bus bars (20') and (21').

(Other Embodiments)

The embodiments of the present invention described above may be modified into the following configurations.

In the embodiments described above, the members connecting the surface-mounting patterns (13L) and (13R) for the shunt resistor (12) and the main circuit patterns (16) and (17) together are supposed to be bus bars (20) and (21) each made of a conductor having high thermal conductivity. However, the present invention is not limited thereto. In short, any other connection member may also be used as long as the connection member is separated from the patterns on the substrate (14) and creates a heat-dissipating space under itself.

Moreover, according to the configuration of the embodiment described above, the respective widths of the surface-mounting patterns (13L) and (13R) for the shunt resistor (12) and bus bars (20) and (21) are supposed to be equal to the length (1) of the electrodes (12a) and (12b) of the shunt resistor (12). However, to achieve the effect of improving the heat dissipation performance of the shunt resistor (12) according to the present invention, such a configuration does not have to be adopted. Nevertheless, when adopted, this configuration will contribute to making the path of current flowing through the shunt resistor (12) uniform, and improving the current detection accuracy of the shunt resistor (12). In order to make the path of the current flowing through the shunt resistor (12) uniform, not all but just portions of the surface-mounting patterns (13L) and (13R) where the electrodes (12a) and (12b) of the shunt resistor (12) are arranged need to have their width set to be equal to the length (1) of the electrode.

Besides, the shunt resistor (12) is supposed to detect the current values of currents in respective phases flowing from the three-phase motor (4) into the electrolytic capacitor (C) in the power converter (1). Alternatively, three shunt resistors may be used to detect, independently of each other, the U, V, and W-phase currents flowing from the three-phase motor (4). Furthermore, the component feeding current does not have to be a motor, and the component into which the current flow does not have to be a capacitor.

INDUSTRIAL APPLICABILITY

As described above, according to a configuration of the present invention, a surface-mounting pattern for a shunt resistor is separated from a current-generating-side pattern or a current-receiving-side pattern, and they are connected together via a connection member which creates a space between itself and a substrate. Consequently, the present invention can be used as an electronic circuit apparatus capable of improving the heat dissipation performance of the shunt resistor and detecting a current value with the shunt resistor without adopting a configuration in which a radiator is bonded to the shunt resistor.

DESCRIPTION OF REFERENCE CHARACTERS 1 power converter
2 converter section
3 inverter section
4 three-phase motor
C electrolytic capacitor
7 current detection circuit
8 controller
10 electronic circuit apparatus
12 shunt resistor
12a, 12b electrode
13L, 13R surface-mounting pattern
14 substrate
16 main circuit pattern on current-generating side
16u, 16v, 16w current-generating point
16a, 16b, 16c sub-pattern
17 main circuit pattern on current-receiving side
Cden current inflow point
20, 21, 20', 21' bus bar (connection member)
20u, 20v, 21w bus bar (connection member)
20a, 20b, 21a, 21b leg
20c, 21c connector
23, 23' space

The invention claimed is:

1. An electronic circuit apparatus in which a shunt resistor, including a resistance element between electrodes, is surface-mounted to a substrate and in which electric current flowing from a current-generating-side pattern into a current-receiving-side pattern is detected by the shunt resistor that is arranged on a path of the electric current, wherein
at least one of the electrodes of the shunt resistor is connected to a surface-mounting pattern on which the shunt resistor is surface-mounted, and
the surface-mounting pattern is connected to the current-generating-side pattern or the current-receiving-side pattern via a connection member which creates a space between the connection member itself and the substrate.

2. The electronic circuit apparatus of claim 1, wherein
the connection member is a bus bar made of a conductor having high thermal conductivity.

3. The electronic circuit apparatus of claim 2, wherein
at a point where the electrode of the shunt resistor is connected to the surface-mounting pattern, the surface-mounting pattern has a width set to be equal to the length of the electrode of the shunt resistor.

4. The electronic circuit apparatus of claim 3, wherein
the connection member includes
a leg arranged on the upper surface of the surface-mounting pattern and having a predetermined height,
a leg arranged on the upper surface of the current-generating-side pattern or the current-receiving side pattern and having a predetermined height, and
a connector connecting the legs together.

5. The electronic circuit apparatus of claim 4, wherein
the current-generating-side pattern is divided into a plurality of sub-patterns each including one current-generating point, and
the sub patterns are connected to the surface-mounting pattern for the shunt resistor via connection members, respectively.

6. The electronic circuit apparatus of claim 3, wherein
the current-generating-side pattern is divided into a plurality of sub-patterns each including one current-generating point, and
the sub patterns are connected to the surface-mounting pattern for the shunt resistor via connection members, respectively.

7. The electronic circuit apparatus of claim 2, wherein
the connection member includes
a leg arranged on the upper surface of the surface-mounting pattern and having a predetermined height,
a leg arranged on the upper surface of the current-generating-side pattern or the current-receiving-side pattern and having a predetermined height, and
a connector connecting the legs together.

8. The electronic circuit apparatus of claim 7, wherein
the current-generating-side pattern is divided into a plurality of sub-patterns each including one current-generating point, and
the sub patterns are connected to the surface-mounting pattern for the shunt resistor via connection members, respectively.

9. The electronic circuit apparatus of claim 2, wherein
the current-generating-side pattern is divided into a plurality of sub-patterns each including one current-generating point, and
the sub patterns are connected to the surface-mounting pattern for the shunt resistor via connection members, respectively.

10. The electronic circuit apparatus of claim 1, wherein
at a point where the electrode of the shunt resistor is connected to the surface-mounting pattern, the surface-mounting pattern has a width set to be equal to the length of the electrode of the shunt resistor.

11. The electronic circuit apparatus of claim 10, wherein
the connection member includes
a leg arranged on the upper surface of the surface-mounting pattern and having a predetermined height,
a leg arranged on the upper surface of the current-generating-side pattern or the current-receiving-side pattern and having a predetermined height, and
a connector connecting the legs together.

12. The electronic circuit apparatus of claim 11, wherein
the current-generating-side pattern is divided into a plurality of sub-patterns each including one current-generating point, and
the sub patterns are connected to the surface-mounting pattern for the shunt resistor via connection members, respectively.

13. The electronic circuit apparatus of claim 10, wherein
the current-generating-side pattern is divided into a plurality of sub-patterns each including one current-generating point, and
the sub patterns are connected to the surface-mounting pattern for the shunt resistor via connection members, respectively.

14. The electronic circuit apparatus of claim 1, wherein
the connection member includes
a leg arranged on the upper surface of the surface-mounting pattern and having a predetermined height,
a leg arranged on the upper surface of the current-generating-side pattern or the current-receiving-side pattern and having a predetermined height, and
a connector connecting the legs together.

15. The electronic circuit apparatus of claim 14, wherein
the current-generating-side pattern is divided into a plurality of sub-patterns each including one current-generating point, and
the sub patterns are connected to the surface-mounting pattern for the shunt resistor via connection members, respectively.

16. The electronic circuit apparatus of claim 1, wherein
the current-generating-side pattern is divided into a plurality of sub-patterns each including one current-generating point, and
the sub patterns are connected to the surface-mounting pattern for the shunt resistor via connection members respectively.

* * * * *